(12) United States Patent
Gallagher et al.

(10) Patent No.: US 12,379,438 B2
(45) Date of Patent: Aug. 5, 2025

(54) POLE PIECE

(71) Applicant: NANALYSIS CORP., Calgary (CA)

(72) Inventors: Neal Gallagher, Calgary (CA); Garett M. Leskowitz, Calgary (CA); Adam Paulson, Calgary (CA); Colten Wright, Calgary (CA)

(73) Assignee: NANALYSIS CORP., Calgary (CA)

( * ) Notice: Subject to any disclaimer, the term of this patent is extended or adjusted under 35 U.S.C. 154(b) by 93 days.

(21) Appl. No.: 18/256,470

(22) PCT Filed: Dec. 13, 2021

(86) PCT No.: PCT/CA2021/051793
§ 371 (c)(1),
(2) Date: Jun. 8, 2023

(87) PCT Pub. No.: WO2022/120502
PCT Pub. Date: Jun. 16, 2022

(65) Prior Publication Data
US 2024/0027552 A1 Jan. 25, 2024

Related U.S. Application Data

(60) Provisional application No. 63/124,612, filed on Dec. 11, 2020.

(51) Int. Cl.
G01R 33/383 (2006.01)
G01R 33/3873 (2006.01)
H01F 3/10 (2006.01)

(52) U.S. Cl.
CPC ....... *G01R 33/383* (2013.01); *G01R 33/3873* (2013.01); *H01F 3/10* (2013.01); *H01F 2003/106* (2013.01)

(58) Field of Classification Search
None
See application file for complete search history.

(56) References Cited

U.S. PATENT DOCUMENTS 3,611,223 A  10/1971 Utsumi et al.
4,093,912 A   6/1978 Double et al.
(Continued)

FOREIGN PATENT DOCUMENTS

WO  2011/066652  6/2011

OTHER PUBLICATIONS

International Search Report and Written Opinion of PCT/CA2021/051793, Feb. 23, 2022, 8 pages.
Halbach, K., "Design of Permanent Multipole Magnets with Oriented Rare Earth Cobalt Material," Nuclear Instruments and Methods 169, 1980, pp. 1-38.
(Continued)

*Primary Examiner* — Rodney E Fuller
(74) *Attorney, Agent, or Firm* — Merchant & Gould P.C.

(57) ABSTRACT

A pole piece for use in a Halbach-type magnet configuration, the pole piece having an elongated body adapted for insertion into the Halbach-type magnet configuration and having at least two parts operably and removably connected to each other. The at least two parts of the pole piece comprise a top iron having a front face and a rear face, a bottom iron having a front face and a rear face, and an interstitial shim layer adapted to be inserted in a shim cavity defined by a depression formed in at least one of: the front face of the top iron and the rear face of the bottom iron. A method for shimming includes modifying a material content of the shim cavity and inserting the pole piece into the central cavity of the Halbach-type magnet configuration for shimming the magnetic field generated.

20 Claims, 11 Drawing Sheets

(56) References Cited

U.S. PATENT DOCUMENTS

| | | | |
|---|---|---|---|
| 4,580,098 A | 4/1986 | Gluckstern et al. | |
| 4,673,882 A | 6/1987 | Buford | |
| 4,758,813 A | 7/1988 | Holsinger et al. | |
| 5,003,276 A | 3/1991 | Sarwinski et al. | |
| 6,275,128 B1 | 8/2001 | Aoki et al. | |
| 6,566,991 B1 | 5/2003 | Rimkunas et al. | |
| 6,768,407 B2 * | 7/2004 | Kohda | H01F 7/0278 335/306 |
| 7,199,689 B1 | 4/2007 | Abele | |
| 9,341,690 B2 | 5/2016 | Leskowitz et al. | |
| 2002/0179830 A1 | 12/2002 | Pearson et al. | |
| 2009/0128272 A1 | 5/2009 | Hills | |
| 2010/0244828 A1 | 9/2010 | Pines et al. | |
| 2011/0057655 A1 | 3/2011 | Ando et al. | |
| 2011/0137589 A1 * | 6/2011 | Leskowitz | G01R 33/3875 702/57 |
| 2017/0254866 A1 * | 9/2017 | Haenichen | G01R 33/389 |
| 2022/0171004 A1 * | 6/2022 | Freytag | G01R 33/3804 |

OTHER PUBLICATIONS

Moresi, G. et al., "Miniature Permanent Magnet for Table-top NMR," Concepts in Magnetic Resonance Part B: Magnetic Resonance Engineering 19B (1), 2003, pp. 35-43.

Rose, M. E., "Magnetic Field Correction in the Cyclotron," Physical Review 53, 1938, pp. 715-719.

Bloch, F. et al., "Innovating Approaches to the Generation of Intense Magnetic Fields: Design and Optimization of a 4 Tesla Permanent Magnetic Flux Source," IEEE Transactions on Magnetics 34, 1998, pp. 2465-2468.

Extended European Search Report received for EP Application No. 21901778.7 on Sep. 25, 2024, 14 pgs.

* cited by examiner

POLE PIECE

CROSS-REFERENCE TO RELATED APPLICATIONS

This application claims the priority or benefit of U.S. provisional patent application 63/124,612 Dec. 11, 2020, the specification of which is hereby incorporated herein by reference in its entirety.

BACKGROUND (a) Field

The subject matter disclosed generally relates to pole pieces and uses thereof.

(b) Related Prior Art

Relevant background documents include:
Ernst, R. R., Bodenhausen, G., and Wokaun, A., Principles of Nuclear Magnetic Resonance in One and Two Dimensions, International Series of Monographs on Chemistry—14, Oxford University Press, 1990.
Halbach, K., "Design of Permanent Multipole Magnets with Oriented Rare Earth Cobalt Material," Nuclear Instruments and Methods 169, 1-10, 1980.
Moresi, G. and Magin, R., "Miniature Permanent Magnet for Tabletop NMR," Concepts in Magnetic Resonance Part B: Magnetic Resonance Engineering 19B (1), 35-43, 2003.
Rose, N. E., "Magnetic Field Correction in the Cyclotron," Physical Review 53, 715-719, 1938.
Hamermesh, M., Group Theory and its Application to Physical Problems, Reading, MA, Addison-Wesley, 1962.
Innovating Approaches to the Generation of Intense Magnetic Fields: Design and Optimization of a 4 Tesla Permanent Magnetic Flux
Source, Bloch. F, et al, IEEE Transactions on Magnetics 34, p 2465, 1998.
U.S. patent application, Publication No. US2011/0137589 A1, and PCT Application, Publication No. WO 2011/066652, filed Dec. 1, 2010, both owned by the applicant and entitled "METHOD AND APPARATUS FOR PRODUCING HOMOGENEOUS MAGNETIC FIELDS".
U.S. Pat. No. 3,611,223 to Utsumi, issued Oct. 5, 1971.
U.S. Pat. No. 4,093,912 to Double et al., issued Jun. 6, 1978.
U.S. Pat. No. 4,580,098 to Gluckstern, et al., issued Apr. 1, 1986.
U.S. Pat. No. 4,673,882 to Buford, issued Jun. 16, 1987.
U.S. Pat. No. 4,758,813 to Holsinger et al., issued Jul. 19, 1988.
U.S. Pat. No. 5,003,276 to Sarwinski et al., issued Mar. 26, 1991.
U.S. Pat. No. 6,275,128 to Aoki and Hashimoto, issued Aug. 4, 2001.
U.S. Pat. No. 6,566,991 to Rimkunas and Wahl, issued on May 20, 2003.
U.S. Pat. No. 6,768,407 to Kohda and Kumuda, issued on Jul. 27, 2004.
U.S. Pat. No. 7,199,689 to Abele, issued Apr. 3, 2007.
US Patent application publication 2002/0179830 A1 "HALBACH DIPOLE MAGNET SHIM SYSTEM", published Dec. 5, 2002.
US Patent application publication 2009/0128272 A1 "HALBACH MAGNET ARRAY FOR NMR INVESTIGATIONS", published May 21, 2009.
US Patent application publication 2010/0244828 A1 "ADJUSTABLE PERMANENT MAGNET ASSEMBLY FOR NMR AND MRI", published Sep. 30, 2010.
US Patent application publication 2011/0057655 A1 to Ando et al. "SOFTWARE FOR ADJUSTING MAGNETIC HOMOGENEITY, METHOD FOR ADJUSTING MAGNETIC HOMOGENEITY, MAGNET DEVICE, AND MAGNETIC RESONANCE IMAGING APPARATUS", PUBLISHED Mar. 10, 2011.

Where permissible by law, all references cited herein are hereby incorporated herein by reference in their entirety.

In many areas of technology, it is desirable to control the spatial distribution of magnetic fields carefully. Well-controlled magnetic fields are particularly important in nuclear magnetic resonance (NMR) spectroscopy and other magnetic resonance (MR) applications. In many NMR spectroscopy experiments, a strong, static magnetic field is applied in a region of space that contains a sample under study, and it is desirable that this field be as spatially uniform as possible in order to observe important but subtle variations in the magnetic response of the sample. It is also desirable in many NMR applications to have a static magnetic field that is as strong as is practical.

At least three classes of magnets have been used to provide a strong, static magnetic field in NMR devices: superconducting electromagnets, resistive electromagnets, and permanents magnets. Permanent magnets or arrays thereof can be advantageous in applications where low cost, low maintenance or portability are desirable.

In practice, static magnetic field magnets, including permanent magnets, are often accompanied by pole pieces. The term "pole piece" is more fully defined herein but generally refers to a piece of magnetically permeable material placed in the vicinity of magnets in order to contribute to or shape a magnetic field. In some cases, additional devices or apparatus comprising magnetic materials are provided to shape the magnetic field for applications. Shaping the magnetic field oftentimes includes rendering it more spatially uniform, or "homogeneous".

For example, a shim tray (magnetic field homogeneity adjuster) is disclosed in US patent application 2011/0057655A1 to Ando, et al. The shim tray is of a non-magnetic material, such as plastic or aluminum. The shim trays have a shape of a disk or the like and are provided with a number of threaded screw holes therethrough. Threaded shim bolts are provided, which are made of a magnetically permeable material. In magnetic field homogeneity adjustment, the shim bolts are screwed into the screw holes according to location data provided by a software program. The shim trays are disposed in a magnetic device designed so as to generate a homogeneous magnetic field using superconducting coils.

Disclosed in U.S. Pat. No. 6,275,128 to Aoki & Hashimoto is an MRI magnetic field generator with which the magnetic field uniformity within the imaging field of view of the air gap can be adjusted without having to detach the gradient coils, after the MRI magnetic field generator has been installed with gradient coils already mounted on a pair of magnetic pole pieces. Magnetic material pellets or permanent magnetic pellets for adjusting the magnetic field uniformity are inserted into the required pits disposed in a pattern to adjust the homogeneity of the field.

Such prior art configurations of shim elements are described in the context of large, open magnet devices with large pole structures, such as those used in magnetic resonance imaging devices. There remains a need for improvements to pole pieces, pole piece production methods, and pole piece implementation methods, particularly when shimming a magnetic field produced by a much smaller arrangement of permanent magnets in the tight confines of a Halbach cylinder used in compact NMR applications.

SUMMARY

The present embodiments address these needs.

According to one aspect, there is provided a pole piece for use in a Halbach-type magnet configuration, the pole piece having an elongated body adapted for insertion into the Halbach-type magnet configuration and comprising at least two parts operably and removably connected to each other.

The pole piece may further comprise materials having different magnetic properties.

The materials may comprise a non-magnetic material and a magnetically soft material.

The non-magnetic material may be aluminum and/or the magnetically soft material may comprise Hiperco.

The pole piece may further comprise a first shimming hole adapted to accept the insertion thereinto of at least one cooperating shimming rod.

In an embodiment, the first shimming hole comprises a female screw thread and said shimming rod comprises a cooperating male screw thread so that the shimming rod can be screwed into the pole piece.

In an embodiment, the at least two parts comprise: a top iron having a front face and a rear face; a bottom iron having a front face and a rear face, the bottom iron being adapted to receive and/or be received by the top iron to form an assembled pole piece such that the front face of the top iron faces the rear face of the bottom iron when in an assembled position; a depression formed in at least one of: the front face of the top iron and the rear face of the bottom iron, such that an interstitial shim cavity is formed by the depression when the top iron and the bottom iron are in an assembled position; and an interstitial shim layer provided in the interstitial shim cavity.

In an embodiment, the material is removed from one or more of: the interstitial shim layer, the top iron and the bottom iron to define a cutout space.

In an embodiment, the cutout space resulting from the removal is filled wholly or in part with another material having different magnetic properties.

In an embodiment, a depth of the depression is greater than a thickness of the interstitial shim layer to allow for insertion of a material having the same or different magnetic properties above or underneath the interstitial shim layer for shimming a magnetic field generated by the Halbach-type magnet configuration.

In an embodiment, the front face of the top iron defines a cut-away region shaped and dimensioned to improve a homogeneity of a magnetic field generated by the Halbach-type magnet configuration in which the pole piece is to be inserted.

In an embodiment, a non-magnetic material is placed in the cut-away region to receive one or more shimming inserts.

The non-magnetic material may be aluminum.

The pole piece may further comprise a second shimming hole adapted to accept the insertion thereinto of at least one shimming insert.

In an embodiment, the second shimming hole comprises a female screw thread and said shimming insert comprises a cooperating male screw thread so that the shimming insert can be screwed into the pole piece.

According to another aspect, there is provided a method for shimming a magnetic field generated by a Halbach-type magnet configuration, the method comprising:
provilding a pole piece, the pole piece comprising a top iron having a front face and a rear face; a bottom iron having a front face and a rear face, the bottom iron being adapted to receive and/or be received by the top iron to form an assembled pole piece such that the front face of the top iron faces the rear face of the bottom iron; a depression formed in at least one of: the front face of the top iron and the rear face of the bottom iron, such that an interstitial shim cavity is formed by the depression when the top iron and the bottom iron are in an assembled position; and an interstitial shim layer provided in the interstitial shim cavity;
modifying a material content of the interstitial shim cavity by one or more of: removing material from the interstitial shim layer, adding material above or underneath the interstitial shim layer in the interstitial shim cavity, and moving material within the interstitial shim layer; and
inserting the pole piece into a central cavity of the Halbach-type magnet configuration for shimming the magnetic field generated by the Halbach-type magnet configuration.

In an embodiment, modifying the material content comprises modifying chemical and/or physical compositions of the interstitial shim layer.

In an embodiment, modifying the material content includes one or more of: chemical etching, machining, scratching, die-punching, laser cutting, water-jet cutting, grinding and gouging.

In an embodiment, the material added above or underneath the interstitial shim layer or moved within the interstitial shim layer is one of: a ferromagnetic material, a non-ferromagnetic material, or both.

According to another aspect, there is provided a magnetic resonance device comprising the pole piece as described above.

According to yet another aspect, there is provided a method for shimming a magnetic field generated by a Halbach-type magnet configuration at least partly enclosing a sample volume, the method comprising:
identifying a magnetic field inhomogeneity in the sample volume of the Halbach-type magnet configuration, the inhomogeneity being generated by a magnetic field gradient;
providing a multipartite pole piece, the multipartite pole piece comprising a top iron, a bottom iron, and an interstitial shim layer, and the top iron comprising a cut-away region operable to receive a centerpiece of non-magnetic material;
forming a modified pole piece by performing one or more of: removing material from, adding material to, moving material within at least one part of the multipartite pole piece based on the identified magnetic field inhomogeneity; and
inserting the modified multipartite pole piece into the Halbach-type magnet configuration to shim the magnetic field.

The method may further comprise: identifying one or more additional magnetic field inhomogeneities generated by one or more additional magnetic field gradients, respectively; and repeating the step of forming for each of the one or more additional magnetic field inhomogeneities.

The method may further comprise identifying the magnetic field inhomogeneity by simulating or measuring a magnetic field generated by the Halbach-type magnet configuration.

The method may further comprise one or more of:
adjusting a position of at least one shimming rod in at least one first shimming hole defined by the bottom iron; and
adjusting a position of at least one shimming insert in at least one second shimming hole defined by the top iron.

The present disclosure describes a multipartite pole piece, which may alternatively be referred to as a split-body pole piece. The pole piece comprises more than one part. The pole piece may comprise more than one portion of magnetically permeable material. The pole piece may be assembled from more than one portion of magnetically permeable material. In an embodiment, a body is disclosed comprising more than one piece of magnetically permeable material, wherein the body is used for suppressing magnetic field inhomogeneity. The body comprises more than one piece, wherein the body is positioned in a magnet array.

The body may comprise more than one piece of magnetically permeable material, wherein the body is positioned in a magnet array and the body is shaped and sized for modifying inhomogeneities in the magnetic field generated by the magnet array.

The body may comprise more than one piece of magnetically permeable material, wherein each of the more than one pieces of the body is shaped and sized for modifying inhomogeneities in a magnetic field generated by a magnet array. Each individual piece may comprise a portion that is removed, and the space (cutout space, volume) left by said removal may be filled wholly or in part with a shape of another material having different magnetic properties.

In an embodiment, a pole piece is disclosed comprising a top iron having a front face and a rear face; a bottom iron having a front face and a rear face, the bottom iron being adapted to receive and/or be received by the top iron to form an assembled pole piece such that the front face of the top iron faces the rear face of the bottom iron when in an assembled position; a depression formed in at least one of: the front face of the top iron and the rear face of the bottom iron, such that an interstitial shim cavity is formed by the depression when the top iron and bottom iron are in an assembled position; and an interstitial shim layer provided in the interstitial shim cavity. As with the other individual pieces of the multipartite pole piece, the interstitial shim layer may comprise a portion that is removed, and the cutout space (volume) left by said removal may be filled wholly or in part with a shape of another material having different magnetic properties.

The pole piece may have a depth of the depression that is greater than a thickness of the interstitial shim layer to allow for insertion of material above or underneath the interstitial shim layer for shimming a magnetic field.

Disclosed is a method for shimming a magnetic field, the method comprising providing a pole piece. The pole piece comprises a top iron having a front face and a rear face; a bottom iron having a front face and a rear face, the bottom iron being adapted to receive and/or be received by the top iron to form an assembled pole piece such that the front face of the top iron faces the rear face of the bottom iron; a depression formed in at least one of: the front face of the top iron and the rear face of the bottom iron, such that an interstitial shim cavity is formed by the depression when the top iron and bottom iron are in an assembled position; and an interstitial shim layer provided in the interstitial shim cavity.

The method comprises modifying the material content of the interstitial shim cavity by one or more of: removing material from the interstitial shim layer, adding material above or underneath the interstitial shim layer in the interstitial shim cavity, and moving material within the interstitial shim layer for shimming the magnetic field. Modifying the material content may comprise modifying chemical and/or physical compositions of the interstitial shim layer. In this disclosure, the term "material content" refers to the content (the material or the matter) in the interstitial shim cavity, including the interstitial shim layer itself and any other added or moved materials in the interstitial shim cavity of the multipartite pole piece.

In an embodiment, the method further comprises modifying the material content by removing material from the interstitial shim layer by chemical etching, machining, scratching, die-punching, laser cutting, water-jet cutting, grinding and/or gouging. The material added above or underneath the interstitial shim layer or moved with in a shim layer may be a ferromagnetic material, a non-ferromagnetic material, or a combination thereof. The material moved within a shim layer may be moved by displacement such as by pushing a slug comprising the material or by rotating the material within threads in the shim layer to which corresponding threads in the material are engaged.

Disclosed is a method for shimming a magnetic field generated by a magnet array, the magnet array at least partly enclosing a sample volume. The method comprises the steps of:
a) identifying a magnetic field inhomogeneity in the sample volume of the magnet array, the inhomogeneity being due to (generated by) a magnetic field gradient;
b) providing a multipartite pole piece;
c) removing, adding, or moving material to at least one part of the multipartite pole piece, to form a modified multipartite pole piece, based on the identified magnetic field inhomogeneity due to the magnetic field gradient; and
d) inserting the modified multipartite pole piece into the magnet array to shim the magnetic field.

The method may further comprise the steps of:
e) identifying one or more additional magnetic field inhomogeneities due to one or more additional magnetic field gradients, respectively; and
f) repeating step c) for each of the one or more additional magnetic field inhomogeneities.

The method may further comprise the step of identifying the magnetic field inhomogeneity by magnetostatic simulation or by mapping the magnetic field. The multipartite pole piece may comprise a top iron, a bottom iron, and one or more interstitial shim layers.

Disclosed is a magnet array comprising at least one multipartite pole piece. Further disclosed is an apparatus for causing magnetic resonance in a sample, the apparatus comprising a multipartite pole piece. Further disclosed is a magnetic resonance apparatus comprising a multipartite pole piece.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Figure 1A:
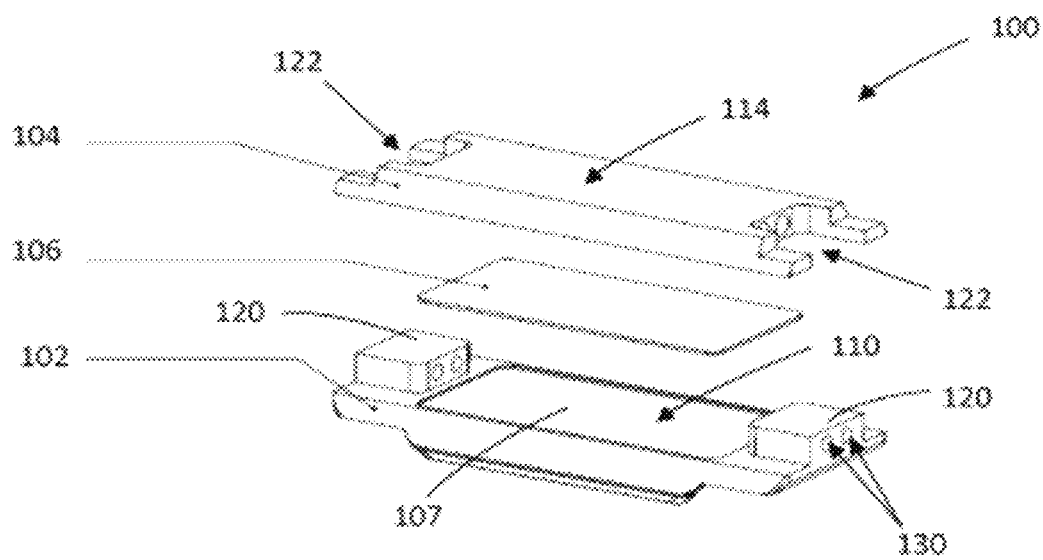
FIG. 1a and FIG. 1b are exploded views, and from different angles, of a multipartite pole piece, in accordance with an embodiment.

The application describes a pole piece for use in a Halbach-type magnet configuration, the pole piece having an elongated body adapted for insertion into the Halbach-type magnet configuration and comprising at least two parts operably and removably connected to each other. The at least two parts of the pole piece comprising a top iron having a front face and a rear face, a bottom iron having a front face and a rear face, and an interstitial shim layer adapted to be inserted in a shim cavity defined by a depression formed in at least one of: the front face of the top iron and the rear face of the bottom iron. A method for shimming is also disclosed which includes modifying a material content of the shim cavity and inserting the pole piece into the central cavity of the Halbach-type magnet configuration for shimming the magnetic field generated.

In the present document the term "pole piece" refers to at least one piece of magnetically permeable material placed in the vicinity of primary magnets for use in contributing to or shaping the primary magnetic field or intended to be placed in the vicinity of primary magnets for use in contributing to or shaping the primary magnetic field. In embodiments pole pieces and assemblies comprising pole pieces are suitable for use in confined spaces, and for example but not by way of limitation, in embodiments pole pieces and assemblies comprising pole pieces are suitable for use in the central space or cavity of a magnet array which in embodiments is a Halbach array and in embodiments is in a magnetic resonance device. In other embodiments, the magnet array comprises a first plurality of magnets arranged in a Halbach cylinder configuration and a second plurality of magnets arranged in a non-Halbach configuration.

The present disclosure contemplates use of pole pieces within confined spaces in magnetic field producing devices. In the present document the term "Halbach-type" magnet array (magnet configuration, magnet assembly) refers to magnet arrays comprising component magnets arranged in a Halbach configuration. Such Halbach-type magnet arrays may also include other magnetic components in addition to those in the Halbach configuration.

In particular embodiments pole pieces consist of or comprise any suitable material or substance, including but not limited to iron, cobalt, nickel, and alloys thereof and may be of any suitable shape and size. In particular embodiments pole pieces are broadly prismic, or are broadly trapezoidal in cross section, and have a front face or a rear face or a front face and a rear face, or a front face, a rear face, ends and a length. It will be understood that in use, the front face of a pole piece is or comprises a surface of the pole piece that is oriented towards or is proximate to a defined volume or sample volume or sample, and distal to an associated magnet or magnet assembly whose field the pole piece is intended to influence. Conversely the rear face of a pole piece refers to a surface or portion of the surface of the pole piece that is proximate to one or more magnets whose field the pole piece is intended to influence and distal to a defined or sample volume wherein a sample is to be positioned.

In the present document a "magnet array" into which a pole piece is inserted means an arrangement of magnets configured to generate a desired magnetic field and may include a Halbach cylinder, Halbach sphere, other Halbach array or an array comprising magnets arranged in Halbach and non-Halbach configurations. In embodiments pole pieces are comprised in or are used in association with any form of magnet array, including but not limited to arrays wherein one or more primary magnets may be placed outside each pole piece, and wherein a permeable magnetic material may be placed further outside the primary magnets so as to confine magnetic flux.

In the present document the term "shimming" refers to any method for suppressing magnetic field inhomogeneity, including but not limited to inhomogeneity in a primary field generated by a magnet array. For greater certainty it will be understood that the term shimming includes both active shimming, wherein the shimming effect may be achieved by the application of a current to thereby generate an induced and user-determined magnetic shimming field, and passive shimming wherein the shimming effect is achieved solely by the positioning of a ferromagnetic or other object having predetermined magnetic properties.

In the present document "suppressing" an inhomogeneity refers to any adjustment to the geometrical or functional components of a magnetic field to correct or smooth out or otherwise adjust, overcome or modify undesired irregularities or distortions in the field. Suppressing according to embodiments comprises complete or partial suppressing and in embodiments affects one or more geometrical or functional components of the field. In particular embodiments suppressing is actuated to cause a magnetic field to adopt a predetermined desired degree of homogeneity.

It is convenient when characterizing a magnetic field to consider the spatial dependence of the field, that is, to represent the field, $\vec{B}(x, y, z)$ as a function of spatial coordinates, such as Cartesian coordinates (x, y, z) defined with respect to an origin point. Said function of coordinates may itself further be described, or estimated for the purposes of analysis, as a sum or expansion on a set of basis functions:

$$\vec{B}(x,y,z) = B_0\hat{z} + \Sigma_i a_i \vec{g}_i(x,y,z).$$

where $\hat{z}$ denotes a unit vector along the z-coordinate axis, where $g_i(x, y, z)$ denote said basis functions, and where $B_0$ and $a_i$ denote coefficients.

In the present document, a "functional component" of a magnetic field means the strength of the part of the field characterized by a given $g_i(x, y, z)$ in this type of expansion as quantified by its corresponding coefficient, $a_i$. Moreover, suppressing the inhomogeneity corresponding to such a functional component means reducing the numerical value of the corresponding coefficient. In the present document, sometimes these individual functional components are called "gradients" or "magnetic field gradients".

In embodiments of the subject matter hereof, the magnetic field is a primary magnetic field and is generated or maintained within a magnetic resonance device, which in embodiments is a nuclear magnetic resonance (NMR) machine, and in embodiments is a spectrometer and in embodiments is a compact NMR machine.

In the present document the term "magnetic resonance" or "MR" means resonant reorientation of magnetic moments of a sample in a magnetic field or fields, and includes nuclear magnetic resonance (NMR), electron spin resonance (ESR), magnetic resonance imaging (MRI) and ferromagnetic resonance (FMR). As the present disclosure pertains to methods and apparatuses for rendering general static magnetic fields more uniform, in embodiments the disclosure is also applicable in ion cyclotron resonance (ICR) or in trapped-ion or particle-beam technology generally. For simplicity of explanation, the term magnetic resonance or MR as used herein will be understood to include all these alternative applications. In particular applications and embodiments the apparatuses and methods disclosed are applied to NMR and in embodiments they are applied to NMR spectrometers or to NMR imagers. Materials that display magnetic resonance when exposed to a magnetic field are referred to as magnetically resonant or MR active nuclides or materials.

In the present document the term "sample" has its broadest possible meaning consistent with the disclosure hereof and means any item or material that may be, or may be desired to be, examined or tested using magnetic fields or within which it may be desired to induce or measure or detect magnetic resonance, or which it may be desired to examine using embodiments of the subject matter disclosed herein. In particular embodiments samples include or comprise or consist of solid and non-solid objects and materials, living, non-living or deceased materials, chemicals, structures, devices, gases, liquids, and solids, or any combinations of any of the foregoing. In particular embodiments and without limitation a sample includes one or more organisms or tissues, and such organisms or tissues are or include plants, animals, and microorganisms, and include human and animal subjects or parts thereof. Without limitation the term sample includes experimental or medical subjects of any kind whatsoever, whether living, deceased or non-living.

In the present document, the term "sample volume" refers to a volume of space wherein a sample may be placed and exposed to a main or primary magnetic field for the purposes of detecting the magnetic resonance properties of the sample, including determining the presence, absence, or characteristics of magnetic resonance in the sample. The sample volume is of any suitable dimensions and in embodiments is enclosed or partly enclosed and is or is capable of being a vacuum or partial vacuum or being atmosphere-controlled. In embodiments the sample volume is a region within the central space or cavity of a magnet array. In embodiments the sample volume has disposed thereabout pole pieces, shim paths, shim panels and such other apparatus as may be necessary or desirable for applying magnetic resonance to the sample and analyzing the sample. In particular embodiments the sample volume is or is within or comprises a hexagonal or cylindrical or other shaped cavity and in embodiments is bounded by one or more or a plurality of magnets, pole piece faces, glass tubes, or other physical means of confinement, or is defined by an abstract geometrical surface relative to a point in space. In embodiments the sample volume comprises or defines space for apparatus(es) suitable to spin, rotate or otherwise move or position the sample.

In the present document the term "channel," where used with reference to a pole piece, means any form of channel, groove, recess, or concavity in a surface of the pole piece and any adjustment to a volume or portion of the pole piece that reduces or changes the magnetic permeability in that volume or portion of the pole piece.

In embodiments a channel is filled with any desired material which has desired magnetic or non-magnetic properties, or is chosen to strengthen, lighten, intensify, diminish, or otherwise modify or adjust the physical and magnetic properties of the pole piece in a manner desired by a user.

In embodiments a channel extends for all or substantially all of the length of a pole piece and in embodiments a channel extends for a fraction of the length of the pole piece, which fraction may be substantially less than the length of said pole piece and may be more or less than about 10%, 20%, 30%, 40%, 50%, 60%, 70%, 80%, or 90% of the length of the pole piece. In embodiments, a material used to fill a shaped channel in a top iron, interstitial shim layer, or bottom iron may comprise holes, depressions, or other shaped features, and said holes may be threaded and left open or provided with screw-shaped inserts that are threaded correspondingly to permit movement of the inserts.

Where multiple channels are provided in embodiments a plurality of channels are of substantially the same dimensions and in alternative embodiments channels have different dimensions. In embodiments one or more of the inner surfaces of a channel are optionally textured in all manner of ways and in embodiments are partly or wholly substantially smooth, ridged, corrugated, grooved, dimpled, scratched and in embodiments bear protrusions or recesses or both protrusions and recesses and in embodiments any grooves, ridges, corrugations, dimples, scratches and other surface features are oriented in any desired directions. It will be understood that ridges, whether present in a channel or on the front face or other surface of a pole piece, may have a range of geometries and in particular embodiments ridges are of uniform cross-section, uniform height, uniform separation, uniform length and uniform orientation. In alternative embodiments ridges are of non-uniform cross-section, non-uniform height, non-uniform separation, non-uniform length and non-uniform orientation and in embodiments are notched.

In alternative embodiments a channel is produced in a pole piece by cutting, preforming, compression or any other suitable means. Where a plurality of channels is provided these may be sized, shaped and filled in identical manners, or in different manners as required by a user.

In embodiments a pole piece comprises one channel and in alternative embodiments comprises two, three, four, five, six, seven, eight, nine, ten, eleven, twelve or more channels. Where multiple channels are provided then in embodiments they extend for a part or all of the length of the pole piece, or are symmetrically arranged, or are asymmetrically arranged, or are longitudinally oriented or are transversely oriented or are the same or different lengths, depths, widths or otherwise have the same or different geometries or properties. In embodiments comprising more than one channel, such channels may be of equal or different lengths and may be equally or differently spaced from one another. In alternative embodiments channels may be straight or curved and may be continuous or discontinuous along the length or width or the channels.

In the present document the term "shimming rod" or"shimming insert" means a body used to adjust the magnetic field proximate to a pole piece and the term "shimming hole" means a hole in a pole piece shaped and sized to accept the insertion of a cooperating shimming rod thereinto. In embodiments, shimming rods are made of a magnetically permeable material whose magnetic permeability is similar to or the same as that of the pole piece itself or in alternative embodiments the magnetic permeability of the shimming rod is different from that of the pole piece. Shimming rods or shimming inserts and shimming holes according to particular embodiments are cylindrical, or polygonal in shape and boundary, respectively, or have any other cross section and shimming rods and shimming holes are optionally shaped in a variety of manners to allow the desired amount of freedom for the position of the shimming rod to be adjusted relative to the pole piece. In particular embodiments and without limitation, shimming rods and shimming holes have cross sections that are substantially regular or irregular and/or that are substantially circular, oval, triangular, rectangular, square, rhomboidal, pentagonal, hexagonal, heptagonal, octagonal, nonagonal, decagonal or that have 3, 4, 5, 6, 7, 8, 9, 10 or more sides. It will be understood that a shimming hole need not be enclosed on all sides, so that in some embodiments a shimming hole is open along one side.

It will be further understood that in embodiments a shimming rod or rods are positioned relative to a pole piece, but are not inserted thereinto, or are only inserted partially into the shimming hole or partially into a channel in a face of the pole piece. In embodiments a current may be applied to a shimming rod or a shimming rod is otherwise treated to modify the magnetic properties thereof and in embodiments such treatment or current application is dynamic and in embodiments responds to an input and in embodiments such input derives from a user, or from modelling or monitoring or measuring or prediction regarding the magnetic field to be shimmed. It will also be understood that where a shimming rod is to be rotated or is to be threadingly engaged with a cooperating shimming hole, by means of reciprocal threads, then the geometry of the rod and shimming hole will be adjusted to facilitate this use. It will be understood that the descriptor "threadingly" may alternatively be used to describe such reciprocal threading engagement. It will be understood that herein where reference is made to a shimming rod that is associated with a pole piece, it is meant that such shimming rod is proximate to such pole piece, and in embodiments is inserted into such pole piece, and in other embodiments is merely positioned outside of but at a distance from such pole piece.

In embodiments, shimming rods or shimming inserts are threaded and engage a cooperating reciprocal thread on the inside surface of the receiving shimming hole. In embodiments such threading engagement serves to position the rod or insert and to secure the rod or insert into the hole and the geometry of the rod or insert and the rod-receiving or insert-receiving hole will be chosen to permit the necessary rotation.

One way to produce magnetic fields in a specified volume, in magnetic resonance as in other areas of technology, is to place permanent magnets near or around the volume. A relatively efficient design for producing a substantially strong field in a small volume is the Halbach cylinder or sphere, wherein permanent magnet materials are oriented in a well-defined way and arranged around a central cavity. To increase the strength of a magnetic field in a magnet array, the present embodiments describe the use of a specific type of pole pieces. Pole pieces can acquire a magnetic polarization when placed in a magnetic field. This polarization can increase the strength of the magnetic field in the region of space near the pole piece to a value that is larger than it would be in the absence of the pole piece. Sometimes in applications it is desirable to use pole pieces in pairs rather than individually.

The present invention will be more readily understood by referring to the following examples which are given to illustrate the invention rather than to limit its scope.

Figure 1B:
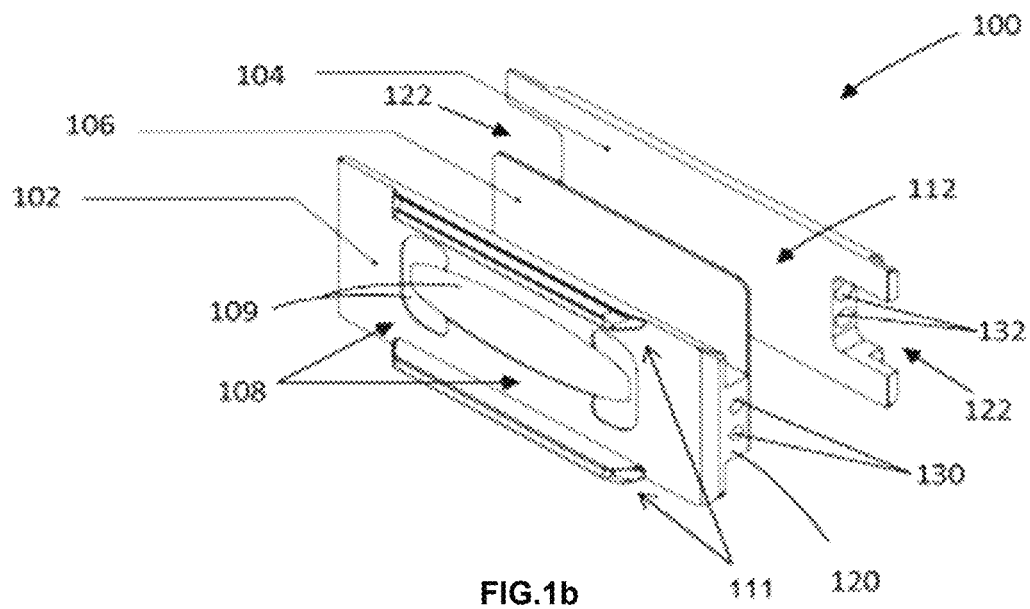
Figure 2A:
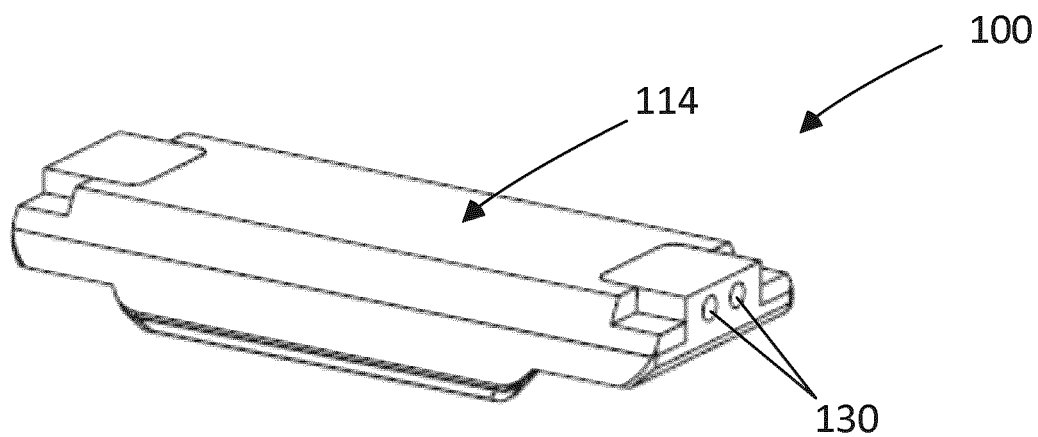
FIG. 2a and FIG. 2b are perspective views, and from different angles, of an assembled multipartite pole piece, in accordance with the embodiment of FIG. 1.
Figure 2B:
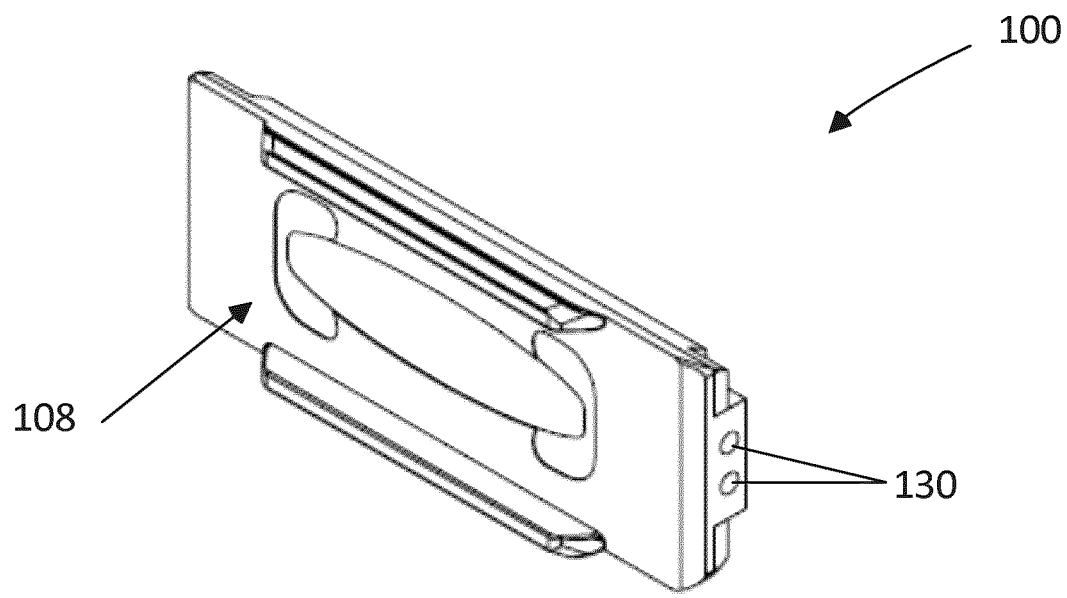

FIG. 1a and FIG. 1b are exploded views, and from different angles, of a multipartite pole piece 100 in accordance with an embodiment, and FIG. 2a and FIG. 2b are assembled views, and from different angles, of the multipartite pole piece 100 in accordance with an embodiment. In the present document the term "multipartite pole piece" means a pole piece comprising more than one part (also called a portion, segment, layer, component, iron or piece) of magnetically permeable material. In this document the term "split-body pole piece" may be used interchangeably with the term multipartite pole piece to describe a multipartite pole piece that can be disassembled (split into) or can be assembled from and comprised of more than one portion of magnetically permeable material.

With reference to FIGS. 1a & 1b, there is illustrated a multipartite pole piece 100 comprising a bottom iron 102, a top iron 104 and an interstitial shim layer 106 provided between the bottom iron 102 and the top iron 104. The bottom iron 102 comprises a front face 108 (facing the exterior of the pole piece) as shown in FIG. 1b and a rear face 110 (facing the top iron 104) as shown in FIG. 1a. The top iron 104 has a front face 112 (facing the bottom iron 102) and a rear face 114 (facing the exterior of the pole piece) as shown in FIGS. 1a and 1b. The assembled multipartite pole piece 100 has a front face 108 which corresponds to the front face of the bottom iron 102, and a rear face 114 which corresponds to the rear face of the top iron 104. A channel (not shown) may in embodiments be provided in the rear face of the pole piece 100. As shown in FIG. 1b, the front face 108 of the pole piece may in embodiments comprise a pattern of depressions 109 that have been formed in the surface. The front face 108 comprises a ridge 111 along each of the long edges of the bottom iron.

In one embodiment, the rear face 110 of the bottom iron 102 comprises a depression (hollow space or cavity) 107 which is adapted to receive the interstitial shim layer 106 when the top iron 104 and the bottom iron 102 are assembled, as shown in FIGS. 2a & 2b.

In another embodiment (not shown), the depression 107 may instead be provided in the front face 112 (facing the bottom iron) of the top iron 104. In yet another embodiment (also not shown), one depression may be provided in the front face 112 of the top iron, and another depression may be provided in the rear face 110 of the bottom iron 102 such that the two depressions face each other and preferably overlap each other to define a single hollow space into which the interstitial shim 106 can be positioned. In this disclosure, this hollow space is called the interstitial shim cavity.

The depression 107 is shaped and dimensioned to receive the interstitial shim layer 106 therein when the top iron is assembled with the bottom iron to form the interstitial shim cavity. In one embodiment, the interstitial shim cavity may have a depth that exceeds the thickness of the interstitial shim layer 106 whereby, additional material may be added on top (or underneath) the interstitial shim layer 106 in order to shim a magnetic field and/or suppress the field's inhomogeneity in order to reach the desired characteristics of a magnet assembly and/or magnetic resonance device into which the pole pieces are assembled, inserted or implemented. This additional material added on top or underneath the interstitial shim layer 106 may in embodiments take the form of flat sheets of one or more shapes, and of the same or a different material than the interstitial shim, top iron or bottom iron. The additional material may be either solid or patterned with holes, slits, pits, channels, or other raised or lowered regions of the additional material. The additional material may be made of ferromagnetic material or non-ferromagnetic material or a combination of ferromagnetic and non-ferromagnetic materials. In embodiments, a portion of the additional material may be made of a magnetically soft, ferromagnetic material and may comprise flat buttons or plates of various sizes, shapes, and thicknesses positioned on top or underneath the interstitial shim layer 106 by a user or machine.

The interstitial shim layer 106 comprises a substantially flat piece of magnetically soft, ferromagnetic metal. The interstitial shim layer 106 comprises a front face (oriented towards the bottom iron 102) and a rear face (oriented towards the top iron 104). In operation, the interstitial shim layer may have material removed therefrom through a variety of subtractive processes not limited to chemical etching, machining, scratching, die-punching, laser cutting, water-jet cutting, grinding and/or gouging. This removal of material is undertaken to shim the magnetic field and/or suppress the field's inhomogeneity in order to reach the desired characteristics of a magnet assembly and/or magnetic resonance device into which the pole pieces are assembled, inserted or implemented. This removal of material may occur in a manner that defines one or more apertures through the entire thickness of the interstitial shim layer. Alternatively, removal of material may take place at either the rear face (top surface) of the interstitial shim or the front face (bottom surface), or on both surfaces, with variable depths of material removed being under the control of the user, machine or process for material removal.

In one example, the interstitial shim layer may have a thickness of about 0.1 mm (about 0.004 inch). The interstitial shim cavity formed from a depression in either the bottom iron or the top iron, or both, which receives the interstitial shim layer in this example may have a corresponding depth of about 0.1 mm (about 0.004 inch) or more than about 0.1 mm (about 0.004 inch) to receive the interstitial shim layer. Alternatively, a depression in each of the bottom iron or the top iron may each have a depth of about 0.1 mm to receive two interstitial shim layers stacked atop one another. Various other alternatives are possible, including a thicker or thinner interstitial shim layer, more than one interstitial shim layer stacked atop one another, and depressions of different depths for receiving the one or more interstitial shim layers in the bottom iron, the top iron, or both the bottom iron and the top iron. In another example, the interstitial shim layer may have a thickness of about 0.1 mm (about 0.004 inch), and the interstitial shim cavity formed from a depression in either the bottom iron or the top iron, or both, which receives the interstitial shim layer may have a corresponding depth of about 0.2 mm or 0.3 mm or more to receive the interstitial shim layer, with the interstitial shim layer positioned within the interstitial shim cavity with an intervening space above or below it in the cavity, the space configured to receive shaped pieces of ferromagnetic or non-magnetic material.

In embodiments, removal of material from the interstitial shim layer may be combined with addition or movement of material into the interstitial shim cavity, and these modifications may further be combined with patterned removal of material from the front or rear faces of the top and/or bottom irons of the multipartite pole piece through manual and/or automated processes including but not limited to chemical etching, machining, scratching, die-punching, laser cutting, water-jet cutting, grinding and/or gouging.

In embodiments, the interstitial shim layer may comprise threaded holes and corresponding threaded inserts (screws), and movement of material within the interstitial shim layer may comprise adjusting the threaded inserts by rotating them into or out of the threaded holes. In embodiments, the interstitial shim layer or the bottom iron or top iron may comprise a shaped portion of another material that is the result of removing a portion of the interstitial shim layer or bottom iron or top iron and replacing it with the said other material.

In the present disclosure, the particular locations where material is removed from a bottom iron, top iron or interstitial shim layer, or added to the interstitial shim cavity above or below the interstitial shim layer, and in what quantities the material is removed or added, may be calculated by first estimating or measuring a magnetic field configuration within a sample volume, through field mapping or numerical simulation, and then by estimating or measuring amounts of magnetic material to be added or removed from the pole piece configuration to modify the overall magnetic field configuration within the sample volume.

In an embodiment, the bottom iron, the top iron, and the interstitial shim layer are made of magnetically soft, ferromagnetic metals. Examples include iron, cobalt, nickel, steels, or alloys such as permendur, Hiperco, or other materials which acquire a magnetic polarization when placed in a polarizing magnetic field. Hiperco is a class of soft magnetic alloys containing cobalt and other metals.

In embodiments, multipartite pole pieces may be used in pairs, with the front faces of the respective bottom irons positioned so as to face (oppose) one another across a gap. It will be understood that such a gap can be established and maintained by positioning the pole piece pair within a holding structure or framework (sometimes referred to as a cage assembly or pole piece positioner). Said structure or framework may hold the pole pieces essentially fixed in position or, alternatively, may permit adjustments in position to be made by a user or actuator. Such adjustments can be made using one or more of a variety of actuators provided for that purpose, such as (but not limited to) screws, levers, sliders, tilting devices, goniometers, moveable wedges, or the like.

In applications where multipartite pole pieces are used in pairs, it may be useful to position the members of the pair so that their respective front faces are substantially parallel when in a nominal position (for example when the pole piece pair is initially positioned or installed in a magnet array). It may further be useful to define a preferred volume, which may be present in between the two pole pieces, and a central, abstract geometrical feature defined with respect to said volume, such as an origin point, a coordinate system, or a plane, such as a plane that may be substantially parallel to the two front faces of the pole pieces. In embodiments, this preferred volume may comprise a sample volume, which is configured to receive a sample or sample tube. In embodiments, the preferred volume may be a volume in which a user may desire to have a magnetic field that has certain preferred characteristics, such as a degree of spatial homogeneity. In that case, it may be desirable to map or estimate the said characteristics within the preferred volume.

In the exemplary embodiments shown in FIGS. 1a and 1b, the bottom iron 102 defines a protrusion 120 that extends from the rear face 110 of the bottom iron 102. In an embodiment, a protrusion 120 may be provided at each end of the bottom iron 102. In other embodiments, a single protrusion 120 may be provided at one of the two ends. Matching cutouts 122 may be provided in the top iron 104 which allows the protrusion 120 to be received in the matching cutout 122, as illustrated in FIGS. 1a to 2b.

Figure 3:
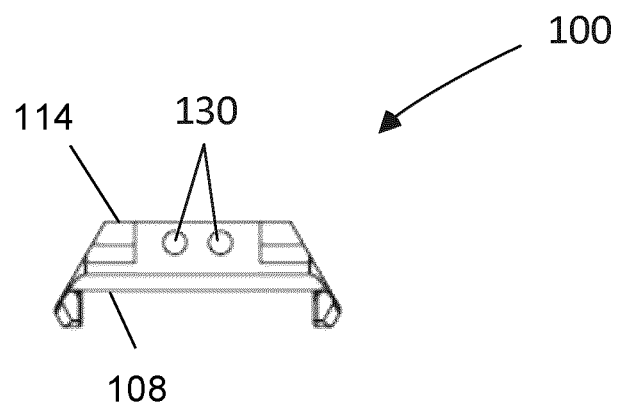
FIG. 3 is an end view of an assembled multipartite pole piece in accordance with the embodiment of FIG. 1.
Figure 4:
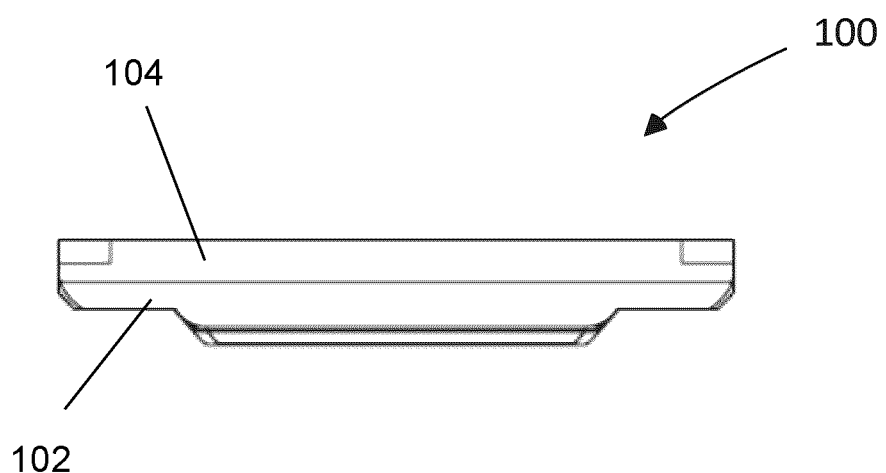
FIG. 4 a side view of an assembled multipartite pole piece in accordance with the embodiment of FIG. 1.

In the embodiments shown in the figures, the protrusions 120 and the cutouts 122 are shaped and dimensioned to define a flat rear face 114 when the top iron and the bottom iron are assembled together as illustrated in FIGS. 3 and 4. FIG. 3 is an end view of an assembled multipartite pole piece in accordance with an embodiment; and FIG. 4 is a side view of an assembled multipartite pole piece in accordance with an embodiment.

A channel may be provided in the rear face of the pole piece 100. The channel may be provided for strengthening, lightening, intensifying, diminishing, or otherwise modifying or adjusting the physical and magnetic properties of the pole piece in a manner desired by a user or as required for a magnetic resonance device in which the pole piece is to be used. The channel may extend for all or substantially all of the length of a pole piece and in embodiments the channel may extend for a fraction of the length of the pole piece. As shown in the figures, shimming holes are provided which allows for inserting cooperating shimming rod(s) into the holes and/or channel for modifying the magnetic field.

In the exemplary embodiments shown in the figures, two shimming holes 130 are provided in the protrusion 120 of the bottom iron 102, and two shimming holes 132 are provided in the top iron 104. The shimming holes 130 and 132 are aligned with each other when the top iron is assembled with the bottom iron in order to allow the shimming rod(s) to travel within the holes until a desired change in the homogeneity of the magnetic field is achieved.

The embodiments of the present invention are not limited to two shimming holes. In other embodiments, a single shimming hole or more than two shimming holes may be used. In further embodiments, there may be an absence of shimming holes.

The multipartite nature of the pole pieces of the present disclosure allows for independent physical modifications to be made to each of the discrete parts of the pole piece prior to implementation in a magnet array or in a magnetic resonance device. Specifically, the rear and front faces of the top iron, the rear and front faces of the bottom iron, and the rear and front faces and body of the interstitial shim(s) can each be physically adapted so that when assembled into the multipartite pole piece as a whole, the effect on the magnetic field of the magnet array is enhanced and/or refined more or with greater convenience than would be possible with a single-part pole piece (a pole piece without multiple parts). Said physical adaptation can include removal of ferromagnetic material using any subtractive process, such as (but not limited to) chemical etching, machining, scratching, die-punching, laser cutting, water-jet cutting, drilling, tapping, grinding and/or gouging.

Said removal may be followed by replacement of the removed material with a non-magnetic material of the same or similar shape for maintaining the strength of the pole piece part, which might otherwise be compromised in the absence of the replacement material. The replaced, shaped material may also serve the purpose of continuing a pattern of depressions, threaded holes, or other features in the pole piece part, which would not be possible if the removed magnetic material were not replaced with the non-magnetic material. Moreover, each of these independent modifications may be combined with a further independent modification, which is the insertion of shaped pieces of magnetic material into the interstitial shim cavity above or below the interstitial shim layer(s), into the top iron, and/or into the bottom iron.

In an embodiment, a magnetic field in a preferred volume may have several functional components of magnetic field inhomogeneity, that is, several individual gradients. A characteristic aspect of the present disclosure is the plurality of regions (the rear and front faces and body of the one or more interstitial shim layers, the rear and front faces of the top iron, the rear and front faces of the bottom iron, and the spaces below and/or above the interstitial shim layer(s) within the interstitial shim cavity), wherein magnetic material can be removed or added to suppress multiple inhomogeneities of magnetic field within the preferred volume. In particular, different gradients can be addressed through modification of different ones of the plurality of regions.

Figure 5:
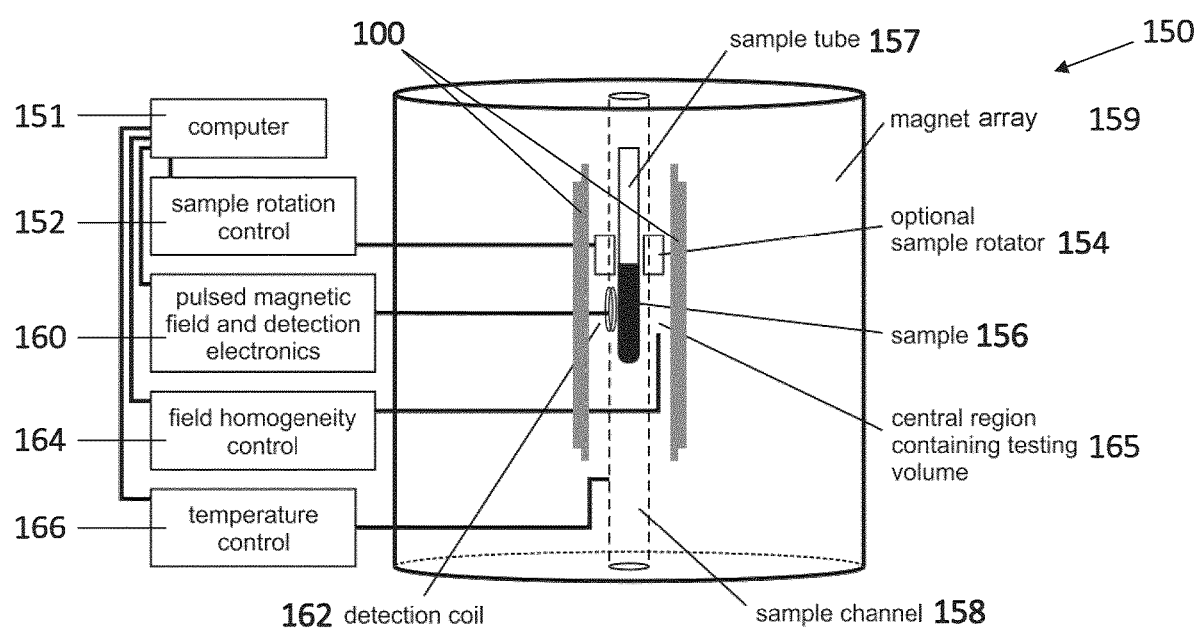
FIG. 5 shows a block diagram of a magnetic resonance device including a magnet array, in accordance with an embodiment of the disclosure.

In embodiments of this disclosure, the magnet array may be comprised in a magnetic resonance apparatus or device. For example, FIG. 5 is an exemplary block diagram of a magnetic resonance device 150 in accordance with an embodiment of the disclosure. Two multipartite pole pieces 100 are shown schematically in FIG. 5. The device 150 further comprises a computer 151 operably connected to a sample rotation control module 152 for controlling rotation of an optional sample rotator 154 used for rotating a sample 156 in a sample tube 157 within a sample channel 158 provided in the magnet array 159. The computer 151 may also be operably connected to a pulsed magnetic field control and signal detection module 160 used for controlling a detection coil 162 and receiving signal therefrom. The device 150 may also include a field homogeneity control module 164 for controlling the magnetic field in a centrally located testing volume 165. A temperature control module 166 may also be provided for controlling the temperature of the magnet array 159 and the temperature inside the channel 158.

Figure 6:
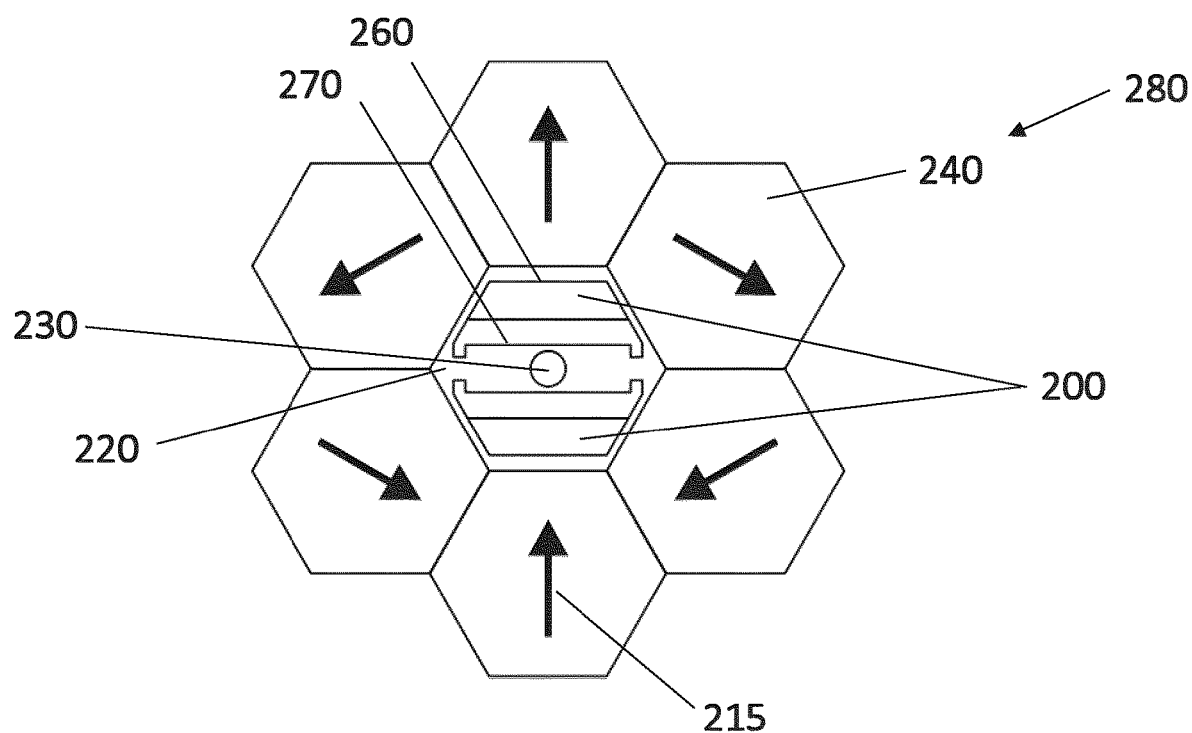
FIG. 6 is a schematic cross-sectional view of a magnet array (assembly) including two multipartite pole pieces in accordance with an embodiment.

FIG. 6 is a cross-sectional view of a magnet array (assembly) 280 including two multipartite pole pieces 200. FIG. 6 provides an example of how the multipartite pole piece(s) of the present disclosure may be positioned in an assembly (array) of magnets which may be configured for use in a magnetic resonance device (not shown).

It will be seen in FIG. 6 that two pole pieces 200 are disposed within the central cavity 220 of a hexagonal Halbach cylinder, Halbach-type or other magnet array 280. In one embodiment, magnet array 280 comprises six individual magnets 240, as shown, each having an individual magnetization direction 215. In alternative embodiments, the six magnets shown are the central six magnets in a larger assembly comprising additional magnets. As will be seen, when in use, the front face 270 of the bottom iron of each pole piece 200 is closest to a central sample volume or sample space 230 and the rear face 260 of the top iron of each pole piece 200 substantially generally conforms to the interior surface of the central cavity 220 defined by the magnet array 280. It will be appreciated that in alternative embodiments the pole pieces may be in accordance with any other embodiments of the subject matter hereof.

Figure 7:
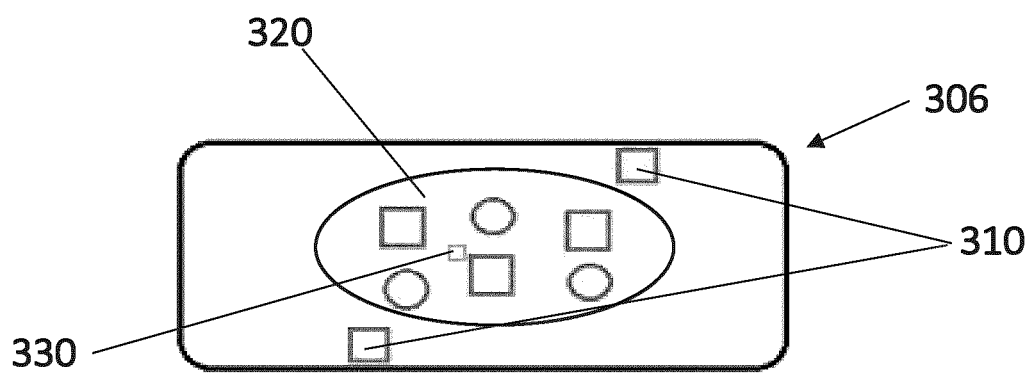
FIG. 7 is a top view of an interstitial shim layer with material added and removed according to an embodiment.

An example of an interstitial shim layer 306 is shown in FIG. 7. Although there are various alternatives for how material can be added and/or removed as described in this disclosure, the example in FIG. 7 illustrates squares of material 310 which have been added and/or affixed above or below the interstitial shim layer 306. This added material 310 may be affixed to the interstitial shim layer using glue or other known chemical or physical techniques. Squares and circles 320 (encircled by an oval in FIG. 7 to indicate which squares and circles are in reference) represent areas where material has been removed from the interstitial shim layer 306. A smaller square of material 330 has also been removed from the interstitial shim layer 306 in this example. The material removed from the interstitial shim layer may create an opening all the way through the interstitial shim layer or there may instead only be enough material removed from the interstitial shim layer to create a depression in the layer rather than an opening in the layer. This removal can take place on the front face or the rear face of the interstitial shim layer.

As described in this disclosure, the choice of the dimensions, material, and location on the interstitial shim layer of the material removed and/or added is determined based on an understanding of the magnetic field gradients generated by a magnet array. Adding and removing material with respect to the interstitial shim layer, top iron and bottom iron in a multipartite pole piece allows for selective improvement of magnetic field inhomogeneities generated by different magnetic field gradients. In applications, improving, suppressing, adjusting, modifying, or shimming the magnetic field may lead to improved performance of magnetic resonance devices comprising the magnet array and multipartite pole pieces for magnetic resonance sample analysis. Such improvement may include rendering the magnetic field more homogeneous in the sample volume.

Figure 8:
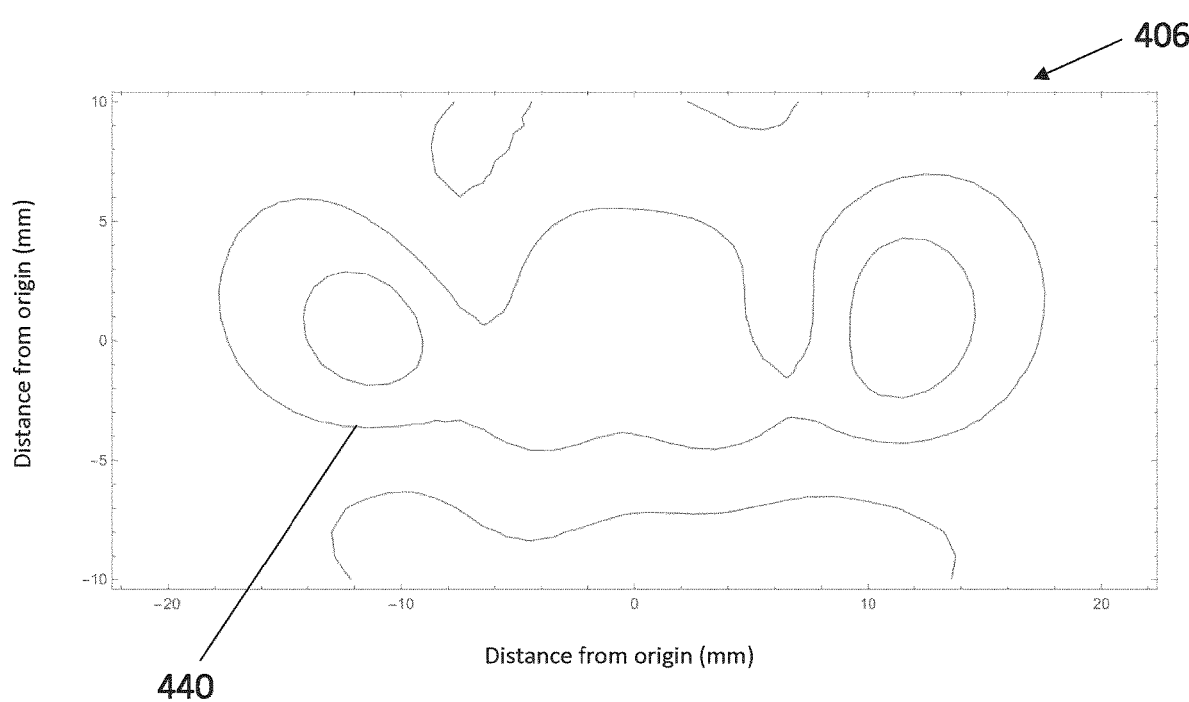
FIG. 8 is a contour plot of thicknesses of material on an interstitial shim layer according to an embodiment.

FIG. 8 is a contour plot of thicknesses of material on an interstitial shim layer 406 according to an embodiment. The interstitial shim layer is shown in top view, and is substantially rectangular in shape, is about 44 mm long, about 20.5 mm wide, and roughly, on average, about 0.1 mm thick. Axes on the periphery are graduated in millimeters and quantify distance from an origin at position (0, 0) at the center of the figure, which corresponds to the center of the interstitial shim layer in this example. Material at the surface of the interstitial shim layer has been removed by a surface machining operation. The contour curves 440 depict contours of equal degree of depression characterizing the removal of material. The removal of material is in accordance with the suppression of field inhomogeneity in the preferred volume (not shown). The example is meant to be illustrative and not restrictive, and dimensions of the interstitial shim layer can be varied in accordance with embodiments.

Figure 9A:
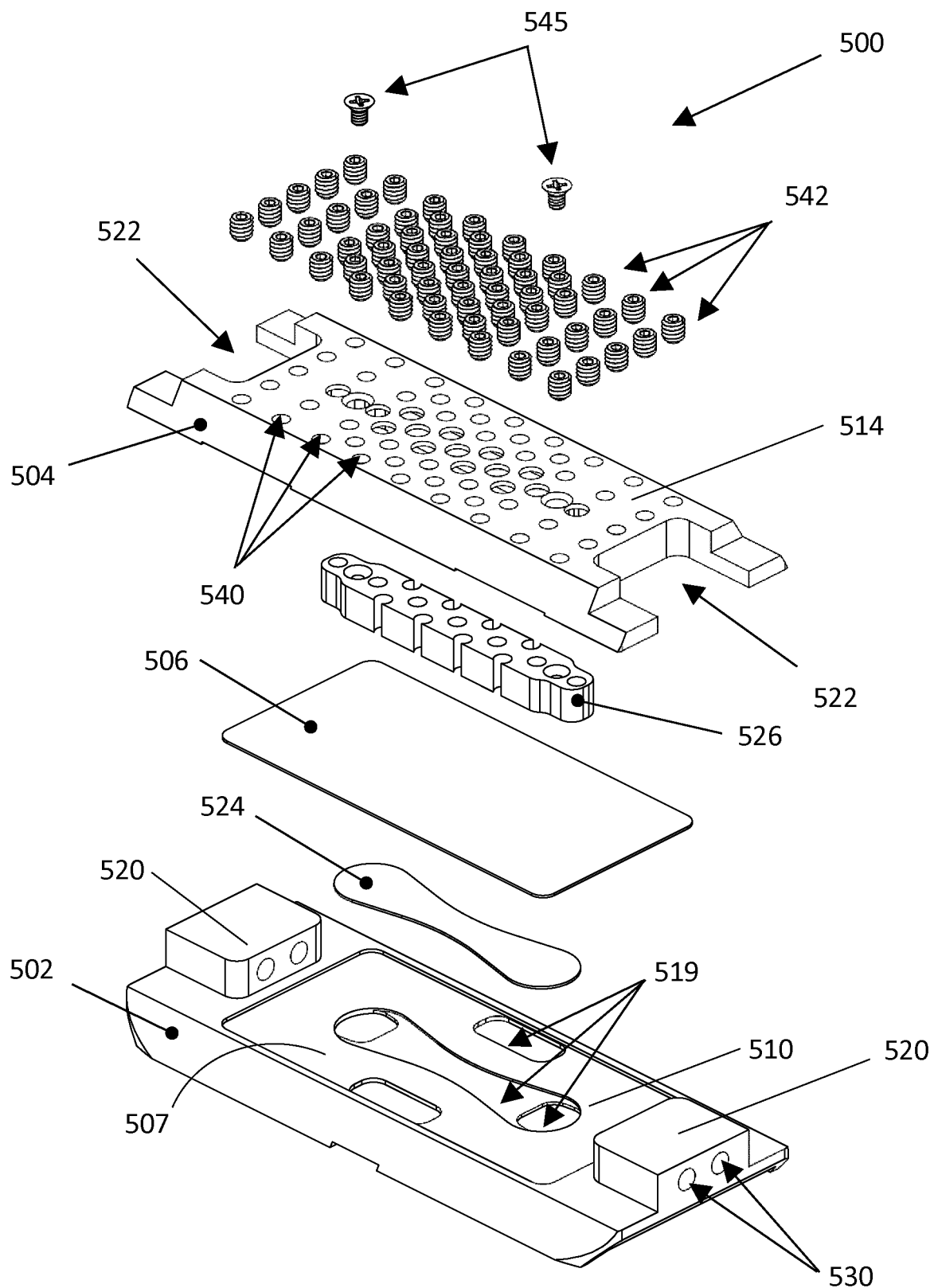
FIG. 9a and FIG. 9b are exploded views, and from different angles, of a multipartite pole piece, in accordance with another embodiment.
Figure 9B:
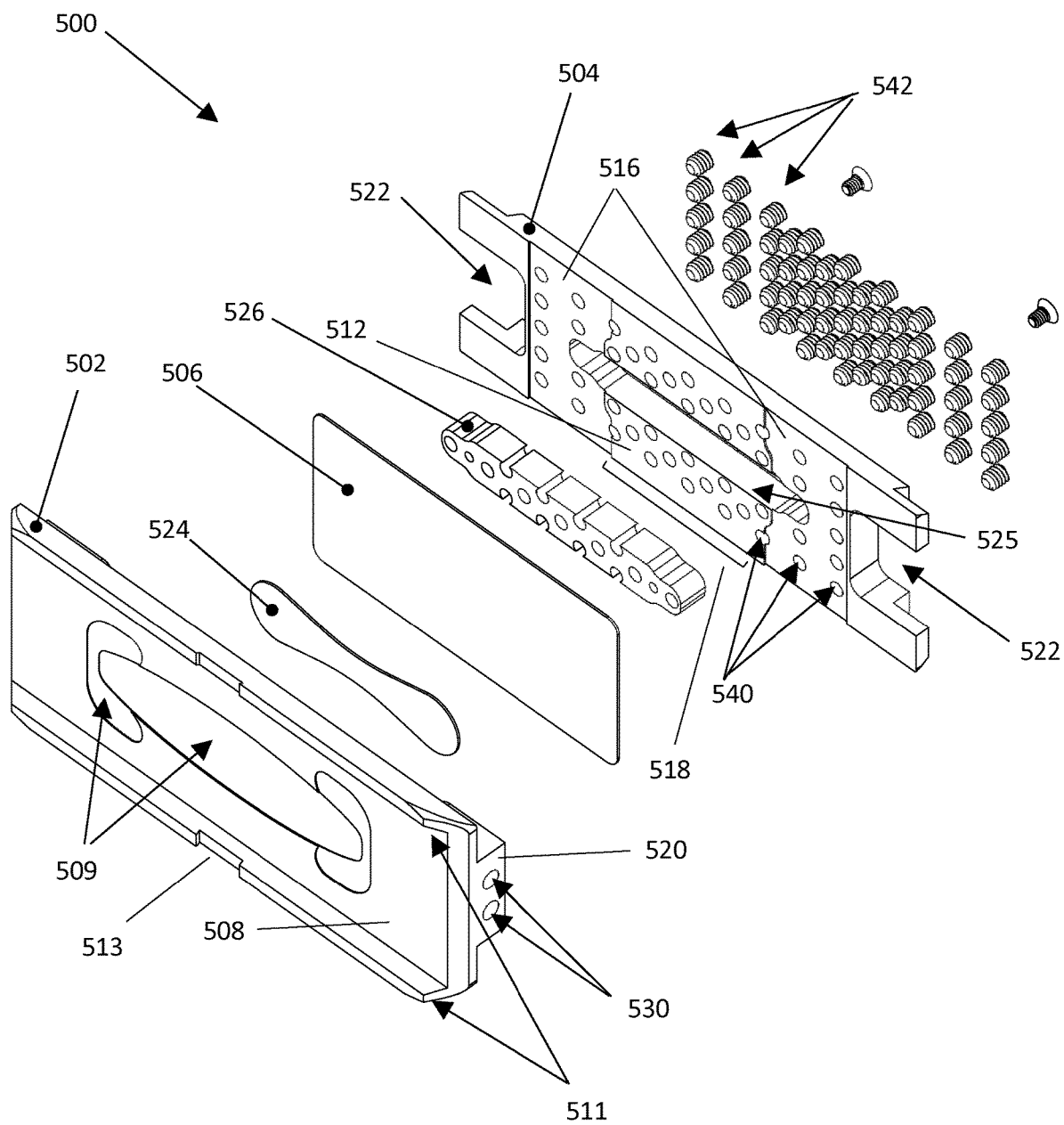

In accordance with another embodiment of the present disclosure, FIG. 9a and FIG. 9b are exploded views, from different angles respectively, of a multipartite pole piece 500. The multipartite pole piece 500 comprises a bottom iron 502, a top iron 504 and an interstitial shim layer 506 provided between the bottom iron 502 and the top iron 504.

Figure 10A:
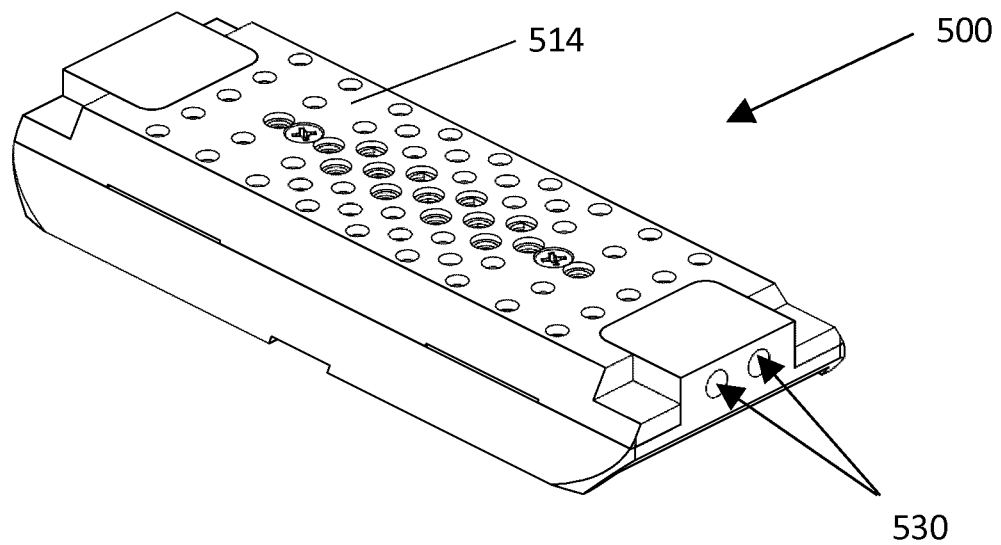
FIG. 10a and FIG. 10b are perspective views, and from different angles, of an assembled multipartite pole piece, in accordance with the embodiment of FIG. 9.
Figure 10B:
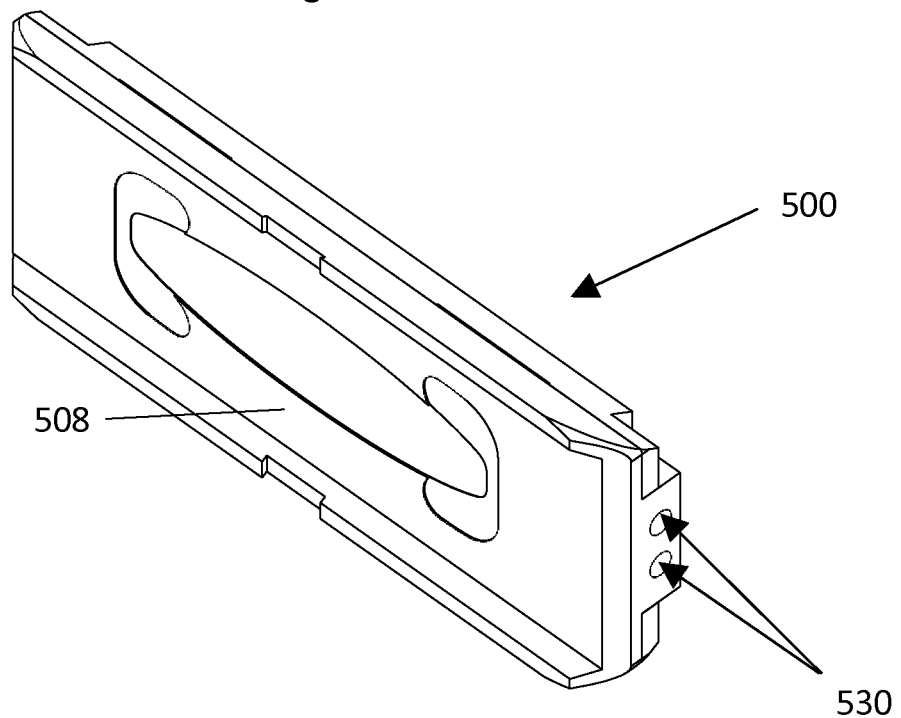

The bottom iron 502 comprises a front face 508 (facing the exterior of the pole piece) as shown in FIG. 9b and a rear face 510 (facing the top iron 504) as shown in FIG. 9a. The top iron 504 has a front face 512 (facing the bottom iron 502) as shown in FIG. 9b and a rear face 514 (facing the exterior of the pole piece) as shown in FIG. 9a. As shown in FIGS. 10a and 10b, the assembled multipartite pole piece 500 has a front face 508 which corresponds to the front face of the bottom iron 502, and a rear face 514 which corresponds to the rear face of the top iron 504. A channel (not shown) may in embodiments be provided in the rear face 514 of the pole piece 500. The front face 508 of the pole piece may in embodiments comprise a pattern of depressions 509 that have been formed in the surface. In this embodiment, the front face 508 comprises a ridge 511 along each of the long edges of the bottom iron and each ridge 511 has a notch (indentation) 513.

In FIGS. 9a and 9b, the bottom iron 502 defines a protrusion 520 that extends from the rear face 510 of the bottom iron 502. In an embodiment, a protrusion 520 may be provided at each end of the bottom iron 502. In other embodiments, a single protrusion 520 may be provided at one of the two ends. Matching cutouts 522 may be provided in the top iron 504 which allows the protrusion 520 to be received in the matching cutout 522, as illustrated in FIGS. 9a to 10b.

Figure 11:
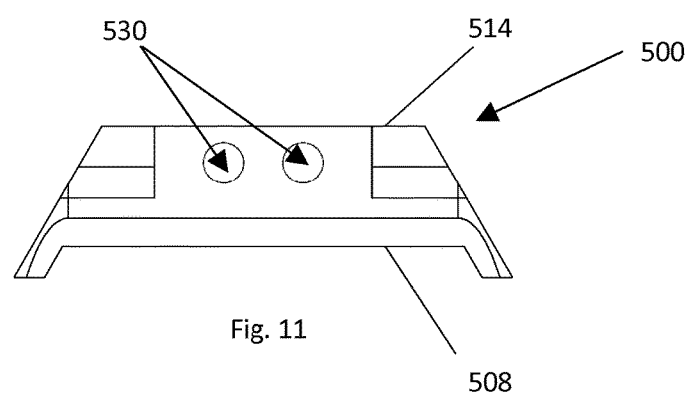
FIG. 11 is an end view of an assembled multipartite pole piece in accordance with the embodiment of FIG. 9.
Figure 12:
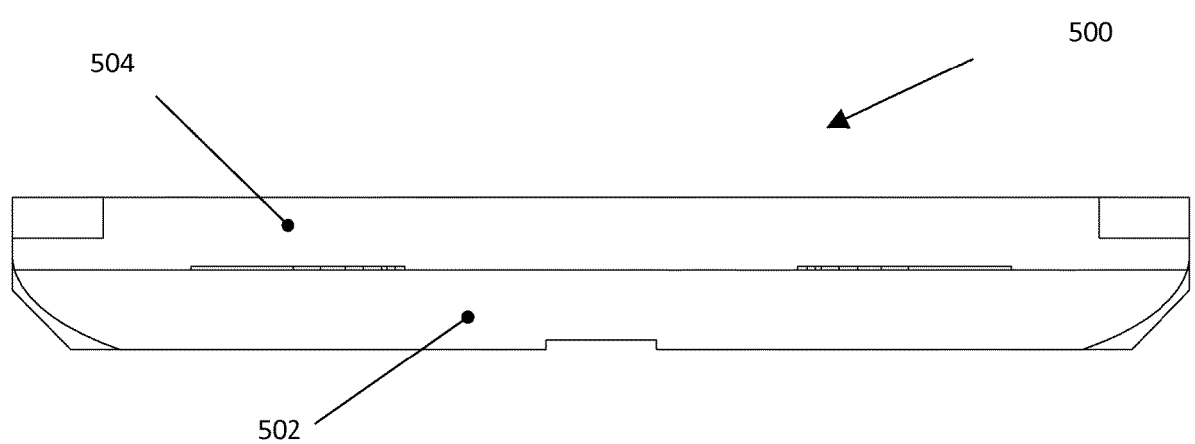
FIG. 12 a side view of an assembled multipartite pole piece in accordance with the embodiment of FIG. 9.

In the embodiments shown in the figures, the protrusions 520 and the cutouts 522 are shaped and dimensioned to define a rear face 514 when the top iron and the bottom iron are assembled as illustrated in FIGS. 11 and 12. FIG. 11 is an end view of an assembled multipartite pole piece in accordance with an embodiment; and FIG. 12 is a side view of an assembled multipartite pole piece in accordance with an embodiment.

The rear face 510 of the bottom iron 502 of the pole piece 500 may in embodiments comprise a pattern of depressions, such as 519 as shown in FIG. 9a, that have been formed in the surface. As with the other individual pieces of the multipartite pole piece, a depression or space created by removal of material from the bottom iron may be filled wholly or in part with another material having different magnetic properties. As shown in FIGS. 9a and 9b, inlay 524 (composed of magnetic or non-magnetic material(s), for example, aluminum, or any of a variety of ceramic or plastic materials, such as Delrin or ABS (acrylonitrile butadiene styrene)) is positioned in (received by) one of the depressions 519 in the rear face 510 of the bottom iron 502. Removing material from the bottom iron 502, or alternatively producing (machining) the pole piece to have depressions such as 509 and 519 contributes to shaping the pole piece to improve or optimize magnetic field homogeneity when the pole piece is implemented in a magnet array or magnetic resonance device. The inlay 524 also serves to provide a surface on which the interstitial shim 506 rests when the pole piece 500 is assembled as in FIG. 10.

As shown in FIG. 9a, the rear face 510 of the bottom iron 502 comprises a depression (hollow space or cavity) 507 which is adapted to receive the interstitial shim layer 506 when the top iron 504 and the bottom iron 502 are assembled, as shown in FIGS. 10*a* and 10*b*, to form an interstitial shim cavity. As described with respect to FIGS. 1*a* and 1*b*, additional material may be added on top of (or underneath) the interstitial shim layer 506, or the interstitial shim layer 506 may have material removed therefrom, to shim the magnetic field and/or suppress the field's inhomogeneity in order to reach the desired characteristics of a magnet assembly and/or magnetic resonance device into which the pole pieces are assembled, inserted or implemented. The interstitial shim layer 506 may be composed of any magnetic material (e.g., low carbon or other types of steel, or nickel, or Hiperco alloy). The interstitial shim layer 506 may vary in thickness in support of tuning the magnetic field. The interstitial shim layer 506 may cover most of the surface of the depression 507 in the bottom iron 502 of the pole piece.

As shown in FIG. 9*b*, the top iron 504 defines a cut-away region 525 in the front face 512 of the top iron 504 and this cut-away region 525 receives a centerpiece 526. The centerpiece 526 may be composed of aluminum, or another non-magnetic material, for example, any of a variety of ceramic or plastic materials, such as Delrin or ABS, and provides a magnetically inert portion within the top iron 504, which is composed of a magnetically soft, ferromagnetic metal such as Hiperco. The shape of the top iron 504 (and thereby the shape of the pole piece 500) with the cut-away region 525 may provide improved magnetic field homogeneity compared to a pole piece not having the cut-away region 525.

Positioning a non-magnetic centerpiece 526 in the cut-away region 525 allows for the high spatial density of second shimming holes 540 in the top iron to continue into the cut-away region 525. This allows the shimming function of the shim inserts 542 to be more versatile than would be possible without the centerpiece 526. More discussion on the second shimming holes is provided herein. The top iron 504 and the centerpiece 526 may be affixed to one another using screws 545 (see FIG. 9*a*) or other fasteners.

The shapes of the cut-away region and the centerpiece are not limited to what is shown in FIGS. 9*a* and 9*b*, and these shapes can be adjusted to improve the overall efficacy of the pole piece in a given magnet array or magnetic resonance device. When a pole piece is produced and implemented in a magnet array or magnetic resonance device, there may be iterations of pole piece machining required to optimize the effect of the pole piece on the homogeneity of the magnetic field generated by the magnet array. By selecting the shapes of the cut-away region and the centerpiece in advance, production time can be saved while improving the quality of the magnetic field for sample analysis.

Although not shown in FIGS. 9 through 12, a channel may be provided in the rear face of the pole piece. The channel may be provided for strengthening, lightening, intensifying, diminishing, or otherwise modifying or adjusting the physical and magnetic properties of the pole piece in a manner desired by a user or as required for a magnetic resonance device in which the pole piece is to be used. The channel may extend for all or substantially all of the length of a pole piece, and in embodiments the channel may extend for a fraction of the length of the pole piece. First shimming holes may be provided at the ends which allow for inserting cooperating shimming rod(s) into the holes and/or channel for modifying the magnetic field.

In the exemplary embodiments shown in the figures, two first shimming holes 530 are provided in each protrusion 520 of the bottom iron 502. The first shimming holes 530 allow inserted shimming rod(s) to travel within the shimming holes, providing a magnetic-field adjustment capability.

FIGS. 9*a* through 12 exhibit two shimming holes 530 for each protrusion 520, for a total of four shimming holes, which can accommodate up to four corresponding shimming rods. In other embodiments, a single first shimming hole for each protrusion or more than two first shimming holes for each protrusion may be used, with corresponding shimming rods provided as needed individually to each first shimming hole to adjust the magnetic field. In further embodiments, there may be an absence of first shimming holes. The shimming rods may be up to 1.5 inches in length or longer as applications to adjust the magnetic field require. Although a pole piece may have additional shimming holes and shimming rods, in the embodiments depicted in FIGS. 1-4 and FIGS. 9-12, up to four shimming rods are inserted into the shimming holes of one pole piece; thus up to eight shimming rods may be used in a magnetic resonance device having two pole pieces (e.g., as shown in FIG. 5). The maximum length of the shimming rods may be shorter or longer depending on the type and size of magnet array or magnetic resonance device incorporating the pole pieces.

As shown in FIGS. 9*a* and 9*b*, the top iron 504 of pole piece 500 defines second shimming holes 540. The second shimming holes 540 are adapted to receive shimming inserts 542 to achieve a change in the homogeneity of the magnetic field. Sixty-one second shimming holes are shown in the top iron 504 in FIGS. 9*a*, 9*b* and 10*a*; however, fewer or more shimming holes may be defined by the top iron. The present disclosure contemplates varying numbers, sizes, and patterns of second shimming holes (with corresponding shimming inserts) as applications require. FIGS. 9*a*, 9*b*, 10*a* and 10*b* show an embodiment comprising two interleaved rectangular configurations of shimming holes coincident with grids of points (one grid is 5×9 points, the other is 4×4 points, for a total of 61 points). The invention disclosed herein includes as alternative embodiments rectangular or hexagonal or triangular grids containing varying numbers of points distributed over the surface of the top iron. A greater number and density of grid points yields finer control over magnetic field homogeneity at the cost of increased complexity.

The shimming inserts 542 may have different lengths from one another and may be inserted into the second shimming holes to differing degrees to improve or optimize magnetic field homogeneity. Depending on the characteristics of the magnetic field to be shimmed, any of the shimming holes may be occupied or unoccupied by a shimming insert and any particular shimming insert that is used may be inserted to varying degrees to shim the magnetic field.

The magnetic field generated by one magnet array (into which pole pieces are then inserted) may differ from that of another magnet array depending on the particular configuration of component magnets or mechanical or magnetic tolerances associated with the materials or manufacturing methods used in construction of the magnet arrays. There may be differences in the magnetic characteristics, material properties and/or shape of each component magnet and/or pole piece provided. These differences may lead to different arrangements of shimming inserts in the second shimming holes for improving or optimizing the magnetic fields generated by different magnet arrays.

In the embodiments shown in FIGS. 9*a*, 9*b*, 10*a* and 10*b*, shimming inserts are threaded and engage a cooperating reciprocal thread on the inside surface of the receiving second shimming hole. In embodiments such threading engagement serves to position the shimming insert and to secure the shimming insert into the second shimming hole. The geometry of the shimming insert and the second shimming hole that receives the shimming insert will be chosen to permit the necessary rotation.

In an embodiment, shimming inserts are screwed into second shimming holes in the top iron of the pole piece substantially along an axis that is coincident with a main magnetic field that magnetically polarizes the soft magnetic material of the pole piece. As shown in FIGS. 9a and 9b, the shimming inserts 542 in this embodiment are threaded into or out of the second shimming holes 540 along this axis, which is perpendicular to the axis along which the shimming rods (not shown) are threaded into or out of the first shimming holes 530.

For a given pole piece, the shimming rods may have different lengths and/or the shimming inserts may have different lengths, allowing for different amounts of magnetic material to be positioned at different locations to improve or optimize the homogeneity of the magnetic field. The length of the shimming insert in embodiments may range from 0.05 inches to 0.16 inches or longer as applications require.

Also shown in FIG. 9b are sections 516 of the top iron 504 that have a reduced thickness. This reduced thickness in sections 516 may be achieved by removing a depth of material from the front face 512 of the top iron 504 or by producing (machining) the pole piece to have a reduced thickness in these sections. The difference in thickness between sections 516 and mid-section 518 of the front face 512 of the top iron 504 may be increased or decreased to improve or optimize magnetic field homogeneity.

When deciding on pole piece characteristics (including but not limited to shape, composition, size, number of parts), even small variations in pole pieces that are in close proximity to the sample in a magnetic resonance device can have significant effects on the magnetic field homogeneity and on results from a sample analysis. Pole piece manufacturing and adjustment to improve or optimize magnetic field homogeneity and provide predictable and scalable production of magnet arrays comprising pole pieces requires that one or more magnetic field inhomogeneities be identified by:

simulating the magnetic field generated by the magnet array;

measuring the magnetic field generated by the magnet array using a field mapping device; or a combination thereof.

Disclosed herein is a method for shimming a magnetic field generated by a Halbach-type magnet configuration. The method, which may be iterative, comprises:

providing a pole piece, the pole piece comprising a top iron having a front face and a rear face; a bottom iron having a front face and a rear face, the bottom iron being adapted to receive and/or be received by the top iron to form an assembled pole piece such that the front face of the top iron faces the rear face of the bottom iron; a depression formed in at least one of: the front face of the top iron and the rear face of the bottom iron, such that an interstitial shim cavity is formed by the depression when the top iron and the bottom iron are in an assembled position; and an interstitial shim layer provided in the interstitial shim cavity;

identifying a magnetic field inhomogeneity generated by a magnetic field gradient by simulating or measuring (using a field mapping device/equipment) the magnetic field generated by the Halbach-type magnet configuration;

modifying a material content of the interstitial shim cavity by one or more of: removing material from the interstitial shim layer, adding material above or underneath the interstitial shim layer in the interstitial shim cavity, and moving material within the interstitial shim layer; and inserting the pole piece into a central cavity of the Halbach-type magnet configuration for shimming the magnetic field generated by the Halbach-type magnet configuration to improve the magnetic field homogeneity.

The method may further comprise:

identifying one or more additional magnetic field inhomogeneities generated by one or more additional magnetic field gradients, respectively; and repeating the step of modifying until the magnetic field homogeneity reaches a desirable level allowing for sample analysis.

The desirable level of magnetic field homogeneity can be determined by comparing measured values of field deviation using a magnetic field mapping device/equipment or by observing the characteristics of a magnetic resonance signal (such as line width or decay time) obtained from a test sample placed inside the magnet configuration.

Disclosed herein is a method for shimming a magnetic field generated by a Halbach-type magnet configuration, the magnet configuration at least partly enclosing a sample volume. The method comprises:

a) identifying a magnetic field inhomogeneity in the sample volume of the Halbach-type magnet configuration, the inhomogeneity being generated by a magnetic field gradient;

b) providing a multipartite pole piece, the multipartite pole piece comprising a top iron, a bottom iron, and an interstitial shim layer, and the top iron comprising a cut-away region operable to receive a centerpiece of non-magnetic material;

c) forming a modified pole piece by performing one or more of: removing material from, adding material to, moving material within at least one part of the multipartite pole piece based on the identified magnetic field inhomogeneity; and d) inserting the modified multipartite pole piece into the Halbach magnet array to shim the magnetic field.

The method may further comprise:

identifying one or more additional magnetic field inhomogeneities generated by one or more additional magnetic field gradients, respectively; and repeating step c) for each of the one or more additional magnetic field inhomogeneities.

The method may further comprise identifying the magnetic field inhomogeneity by:

simulating a magnetic field generated by the Halbach-type magnet configuration; or measuring a magnetic field generated by the Halbach-type magnet configuration using a magnetic field mapping device.

Step c) of the method may comprise:

adjusting a position of at least one shimming rod in at least one first shimming hole defined by the bottom iron;

adjusting a position of at least one shimming insert in at least one second shimming hole defined by the top iron; or a combination thereof.

As described above, in an embodiment of the present disclosure, the pole pieces are attached to a holding structure which positions, for example, two multipartite pole pieces in a suitable arrangement for direct installation or implementation in the central cavity of a magnet array. In exemplary embodiments, the two multipartite pole pieces are positioned with the front faces of their respective bottom irons facing each other across a volume of space that contains a sample volume, parallel to each other, with their front faces substantially perpendicular to a main static magnetic field provided by the magnet array. In embodiments, a pole piece extends the entire length of the magnet array or the central cavity therein. In variant embodiments the pole piece extends for a distance that is longer than the magnet array or cavity therein. In other embodiments, a pole piece extends only a fraction of the length of the cavity or magnet array.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A pole piece for use in a Halbach-type magnet configuration, the pole piece having an elongated body adapted for insertion into the Halbach-type magnet configuration and comprising at least two parts operably and removably connected to each other,
   wherein the at least two parts comprise:
   a top iron having a front face and a rear face;
   a bottom iron having a front face and a rear face, the bottom iron being adapted to receive and/or be received by the top iron to form an assembled pole piece such that the front face of the top iron faces the rear face of the bottom iron when in an assembled position;
   a depression formed in at least one of: the front face of the top iron and the rear face of the bottom iron, such that an interstitial shim cavity is formed by the depression when the top iron and the bottom iron are in an assembled position;
   an interstitial shim layer provided in the interstitial shim cavity.

2. The pole piece of claim 1, further comprising materials having different magnetic properties.

3. The pole piece of claim 2, wherein said materials comprise a non-magnetic material and a magnetically soft material.

4. The pole piece of claim 1, further comprising a first shimming hole adapted to accept the insertion thereinto of at least one cooperating shimming rod.

5. The pole piece of claim 4, wherein the first shimming hole comprises a female screw thread and said shimming rod comprises a cooperating male screw thread so that the shimming rod can be screwed into the pole piece.

6. The pole piece of claim 4, further comprising a second shimming hole adapted to accept the insertion thereinto of at least one shimming insert.

7. The pole piece of claim 6, wherein the second shimming hole comprises a female screw thread and said shimming insert comprises a cooperating male screw thread so that the shimming insert can be screwed into the pole piece.

8. The pole piece of claim 1, wherein material is removed from one or more of: the interstitial shim layer, the top iron and the bottom iron to define a cutout space.

9. The pole piece of claim 8, wherein the cutout space resulting from the removal is filled wholly or in part with another material having different magnetic properties.

10. The pole piece of claim 1, wherein a depth of the depression is greater than a thickness of the interstitial shim layer to allow for insertion of a material having the same or different magnetic properties above or underneath the interstitial shim layer for shimming a magnetic field generated by the Halbach-type magnet configuration.

11. The pole piece of claim 1, wherein the front face of the top iron defines a cut-away region shaped and dimensioned to improve a homogeneity of a magnetic field generated by the Halbach-type magnet configuration in which the pole piece is to be inserted.

12. The pole piece of claim 11, wherein a non-magnetic material is placed in the cut-away region to receive one or more shimming inserts.

13. A magnetic resonance device comprising the pole piece of claim 1.

14. A method for shimming a magnetic field generated by a Halbach-type magnet configuration, the method comprising:
   a) providing a pole piece, the pole piece comprising a top iron having a front face and a rear face; a bottom iron having a front face and a rear face, the bottom iron being adapted to receive and/or be received by the top iron to form an assembled pole piece such that the front face of the top iron faces the rear face of the bottom iron; a depression formed in at least one of: the front face of the top iron and the rear face of the bottom iron, such that an interstitial shim cavity is formed by the depression when the top iron and the bottom iron are in an assembled position; and an interstitial shim layer provided in the interstitial shim cavity;
   b) modifying a material content of the interstitial shim cavity by one or more of: removing material from the interstitial shim layer, adding material above or underneath the interstitial shim layer in the interstitial shim cavity, and moving material within the interstitial shim layer; and
   c) inserting the pole piece into a central cavity of the Halbach-type magnet configuration for shimming the magnetic field generated by the Halbach-type magnet configuration.

15. The method of claim 14, wherein modifying the material content includes one or more of: chemical etching, machining, scratching, die-punching, laser cutting, water-jet cutting, grinding and gouging or otherwise modifying chemical and/or physical compositions of the interstitial shim layer.

16. The method of claim 14, wherein the material added above or underneath the interstitial shim layer or moved within the interstitial shim layer is one of: a ferromagnetic material, a non-ferromagnetic material, or both.

17. A method for shimming a magnetic field generated by a Halbach-type magnet configuration at least partly enclosing a sample volume, the method comprising:
   a) identifying a magnetic field inhomogeneity in the sample volume of the Halbach-type magnet configuration, the inhomogeneity being generated by a magnetic field gradient;
   b) providing a multipartite pole piece, the multipartite pole piece comprising a top iron, a bottom iron, and an interstitial shim layer, and the top iron comprising a cut-away region operable to receive a centerpiece of non-magnetic material;
   c) forming a modified pole piece by performing one or more of: removing material from, adding material to, moving material within at least one part of the multipartite pole piece based on the identified magnetic field inhomogeneity; and d) inserting the modified multipartite pole piece into the Halbach-type magnet configuration to shim the magnetic field.

18. The method of claim 17 further comprising:
e) identifying one or more additional magnetic field inhomogeneities generated by one or more additional magnetic field gradients, respectively; and
f) repeating step c) for each of the one or more additional magnetic field inhomogeneities.

19. The method of claim 17, further comprising identifying the magnetic field inhomogeneity by simulating or measuring a magnetic field generated by the Halbach-type magnet configuration.

20. The method of claim 17, wherein step c) further comprises one or more of:
adjusting a position of at least one shimming rod in at least one first shimming hole defined by the bottom iron; and
adjusting a position of at least one shimming insert in at least one second shimming hole defined by the top iron.

* * * * *